(12) United States Patent
Nguyen

(10) Patent No.: US 7,804,362 B2
(45) Date of Patent: Sep. 28, 2010

(54) DISTRIBUTED AMPLIFIER WITH NEGATIVE FEEDBACK

(75) Inventor: Hung Van Nguyen, San Jose, CA (US)

(73) Assignee: Microsemi Corporation, Irvine, CA (US)

(*) Notice: Subject to any disclaimer, the term of this patent is extended or adjusted under 35 U.S.C. 154(b) by 33 days.

(21) Appl. No.: 12/391,144

(22) Filed: Feb. 23, 2009

(65) Prior Publication Data

US 2009/0212869 A1  Aug. 27, 2009

Related U.S. Application Data

(60) Provisional application No. 61/030,819, filed on Feb. 22, 2008.

(51) Int. Cl.
*H03F 3/60* (2006.01)
(52) U.S. Cl. .................... 330/286; 330/295; 330/54
(58) Field of Classification Search ............ 330/53–54, 330/286, 84, 295, 124 R
See application file for complete search history.

(56) References Cited

U.S. PATENT DOCUMENTS

| 2,930,986 | A | 3/1960 | Kobbe et al. |
|---|---|---|---|
| 4,797,628 | A | 1/1989 | Gruchalla et al. |
| 5,208,547 | A | 5/1993 | Schindler |
| 5,654,670 | A | 8/1997 | Lange |
| 6,049,250 | A | 4/2000 | Kintis et al. |
| 6,342,815 | B1 * | 1/2002 | Kobayashi .................. 330/286 |
| 6,788,148 | B2 | 9/2004 | Orr et al. |
| 6,801,098 | B2 | 10/2004 | Ozawa et al. |
| 7,271,657 | B2 | 9/2007 | Friedrich et al. |
| 2003/0141941 | A1 | 7/2003 | Ozawa et al. |
| 2006/0038623 | A1 | 2/2006 | Yoon et al. |
| 2007/0252651 | A1 | 11/2007 | Gao et al. |
| 2008/0030266 | A1 | 2/2008 | Liu et al. |

FOREIGN PATENT DOCUMENTS

WO WO 02/084863 10/2002

OTHER PUBLICATIONS

Ali Hajimiri, "Distributed Integrated Circuits," Engenious, Winter 2003, pp. 11 through 15.
Guillermo Gonazlez, Ph.D., "Microwave Transistor Amplifiers: Analysis and Design," title page, copyright page, pp. 160-166, Prentice-Hall, Inc., Englewood Cliffs NJ.

* cited by examiner

*Primary Examiner*—Hieu P Nguyen
(74) *Attorney, Agent, or Firm*—Simon Kahn

(57) ABSTRACT

A distributed amplifier may include an input transmission line for receiving on an input end an input signal, and an output transmission line for outputting on an output end an output signal. A plurality of amplifier stages may be coupled between intermediate positions on the input and output lines. Feedback impedance may negatively feed back a signal on the output end of the output line to a second end of the input line spaced from the first end of the input line.

20 Claims, 4 Drawing Sheets

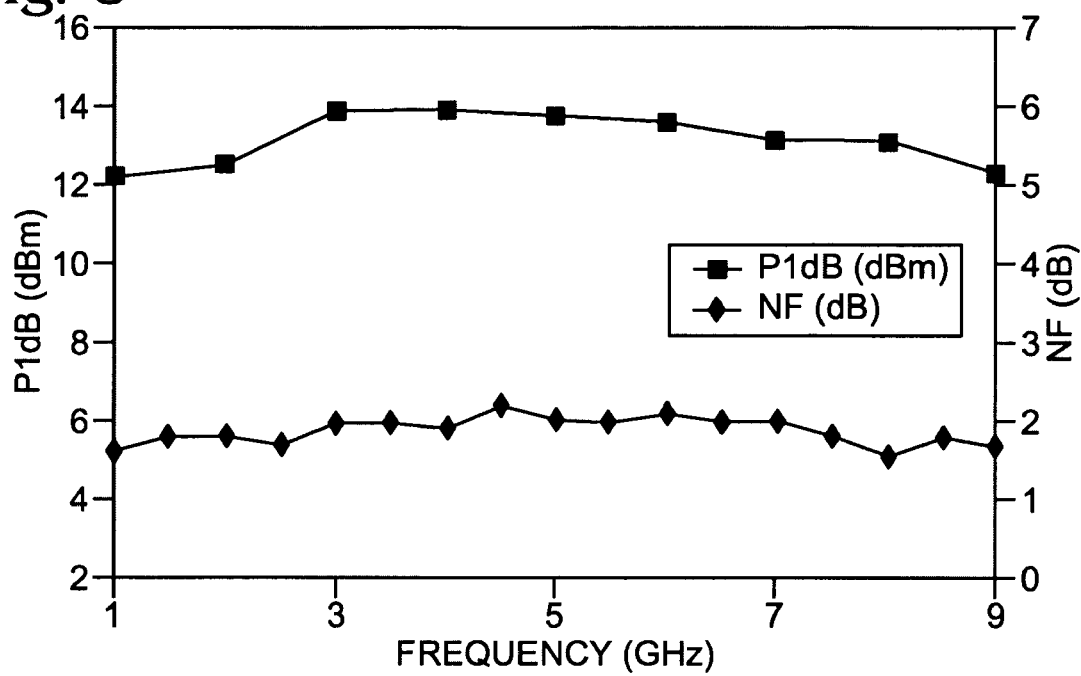

DISTRIBUTED AMPLIFIER WITH NEGATIVE FEEDBACK

RELATED APPLICATION

This application claims the benefit of U.S. Provisional Application No. 61/030,819, filed Feb. 22, 2008, which application is incorporated herein by reference in its entirety for all purposes.

BACKGROUND

Microwave circuits and more particularly distributed microwave circuits are disclosed. Such circuits and associated methods are applicable to telecommunications and other industries in which signals are processed.

Conventional circuits use lumped elements cascaded with isolated separate signal paths. Distributed integrated systems and circuits may rely on shared signal paths that may result in strong electromagnetic couplings between circuit components. A distributed amplifier includes a shared input transmission line and a shared output transmission line. A plurality of transistors, such as field-effect transistors (FETs), connect the input and output transmission lines at spaced locations and provide gain through multiple signal paths. A signal on the input transmission line, also referred to as a gate transmission line, is amplified by each transistor. An incident wave on the output transmission line, also referred to as a drain transmission line, travels toward the output in synchronization with the traveling wave on the input line. Each transistor adds power in-phase to the signal at each tap point on the output line. A forward-traveling wave on the gate line and any backward-traveling wave on the drain line are absorbed by terminations matched to the loaded characteristic impedance of the input line and output line, respectively, to avoid reflections.

Since FETs have intrinsic input capacitance and output capacitance, in general, the presence of these capacitances limits the bandwidth of operation of the FET when used in a conventional amplifier. However, with the distributed approach, the input and output capacitances of the FET become part of the propagation networks forming artificial transmission lines. In this manner, major band-limiting effects of the input and output capacitances of the transistors in reducing frequency bands of operation of the amplifier may be avoided.

SUMMARY

A distributed amplifier may include an input transmission line for receiving on an input end an input signal, and an output transmission line for outputting on an output end an output signal. Feedback impedance may couple the output end of the output line to a second end of the input line spaced from the first end of the input line. The feedback impedance may negatively feed back a signal on the output line to the input line. A plurality of amplifier stages may be coupled between intermediate positions on the input and output lines.

BRIEF DESCRIPTION OF THE DRAWINGS

FIG. 8 is a chart illustrating measured gain and noise factor for the distributed amplifier of FIG. 3.

DETAILED DESCRIPTION

Figure 1:
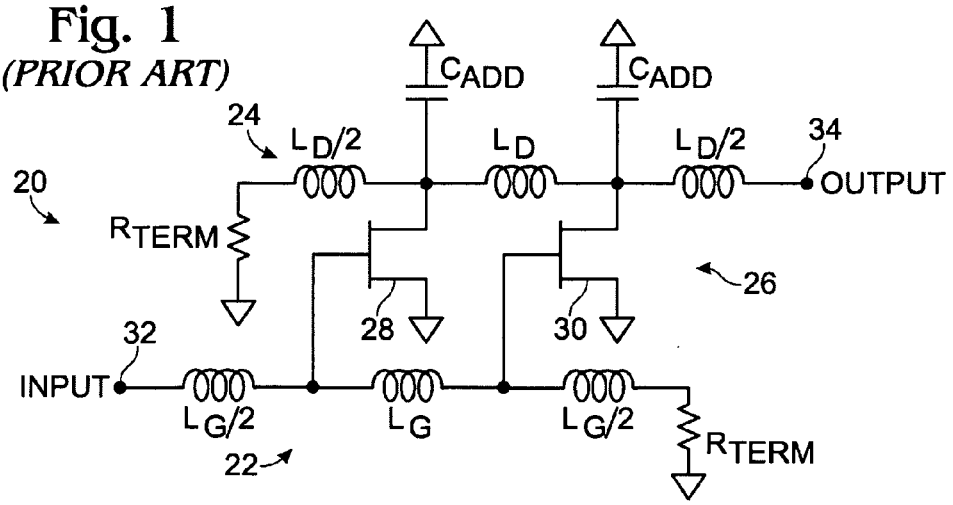
FIG. 1 is a circuit schematic of a conventional distributed amplifier.

FIG. 1 illustrates a conventional distributed amplifier 20. Amplifier 20 includes an input transmission line 22, an output transmission line 24, and a plurality of active devices 26. The active devices may be transistors, such as field-effect transistors (FETs) 28 and 30. FETs 28 and 30 couple the input transmission line to the output transmission line at distributed locations along the transmission lines. Input transmission line 22 is represented by first gate inductance $L_G/2$ connected to a signal input port 32, intermediate second gate inductance $L_G$, and third gate inductance $L_G/2$. The capacitances of the inputs of active devices 28 and 30 are also part of this transmission line. The end of transmission line 22, represented by third gate inductance $L_G/2$, is terminated to ground by a terminating resistor $R_{TERM}$ that has a value that is the same as the characteristic impedance of transmission line 22. It is common for the characteristic impedance, and therefore terminating resistor $R_{TERM}$, to have a value of 50 ohms.

Similarly, output transmission line 24 is represented by first drain inductance $L_D/2$ connected to a signal output port 34, intermediate second drain inductance $L_D$, and third drain inductance $L_D/2$. The end of transmission line 24, represented by third drain inductance $L_D/2$, is terminated to ground by a second terminating resistor $R_{TERM}$ that has a value that is the same as the characteristic impedance of transmission line 24, such as 50 ohms. The drains of the first and second FETs 28 and 30, where they connect to transmission line 24, are also coupled to ground by respective first and second shunt drain capacitors $C_{ADD}$, as shown. The output capacitances of active devices 28 and 30 combined with the capacitances $C_{ADD}$ to ground are also part of this transmission line.

Figure 2:
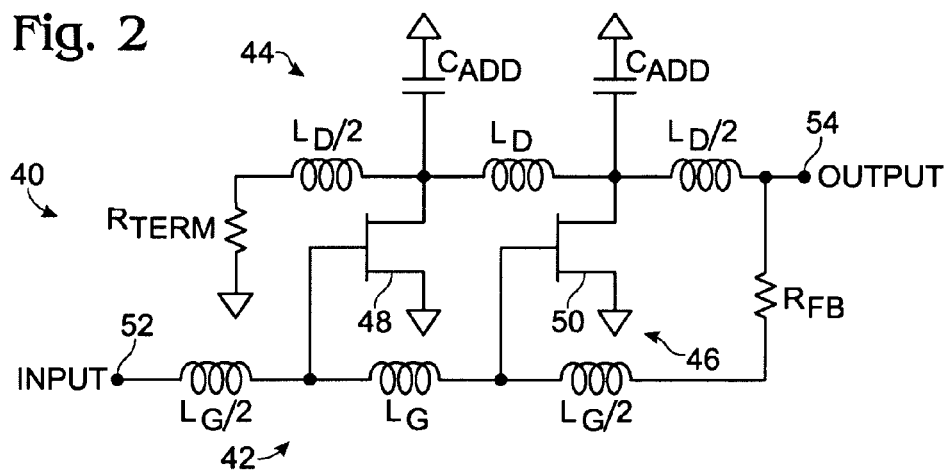
FIG. 2 is a circuit schematic of a first distributed amplifier having feedback.

FIG. 2 illustrates an example of a distributed amplifier 40 having negative feedback. Amplifier 40 may include an input transmission line 42, an output transmission line 44, and a plurality of active devices 46. The active devices may be transistors, such as FETs 48 and 50. FETs 48 and 50 may couple the input transmission line 42 to the output transmission line 44 at distributed locations along the transmission lines. In this example, input transmission line 42 is represented by the series connection of first gate inductance $L_G/2$ connected to or extending from an input end of the transmission line as represented by a signal input port 52, intermediate second gate inductance $L_G$, and third gate inductance $L_G/2$. The capacitances of the inputs of active devices 48 and 50 may also be part of this transmission line.

Similarly, output transmission line 44 may be represented by the series connection of a first drain inductance $L_D/2$ connected to the output end of transmission line 44 represented by a signal output port 54, intermediate second drain inductance $L_D$, and third drain inductance $L_D/2$. The end of transmission line 44, represented by third drain inductance $L_D/2$, may be terminated to ground by a terminating resistor $R_{TERM}$ that has a value that may be the same as the characteristic impedance of transmission line 44, such as 50-ohms. The drains of the first and second FETs 48 and 50, where they connect to transmission line 44, may also be coupled to ground by respective first and second shunt drain capacitors $C_{ADD}$, as shown. The output capacitances of active devices 48 and 50 combined with the capacitances $C_{ADD}$ to ground are also part of this transmission line.

The end of transmission line 42 opposite the input end, represented by the distal end of third gate inductance $L_G/2$, may not be terminated to ground, but rather may be connected to a feedback resistor $R_{FB}$. Resistor $R_{FB}$ may have a value that is substantially more than the characteristic impedance of transmission line 42. For example, the value of feedback resistor $R_{FB}$ may be more than twice the characteristic impedance of transmission line 42. A value that has been found to be effective is about 500-ohms, which is about ten times the value of the characteristic impedance of 50-ohms of transmission line 42. The other end of feedback resistor $R_{FB}$ may be connected to the output end of output transmission line 44 and output port 54.

Distributed amplifier 40 may have more than two active devices 46, and transmission lines 42 and 44 may be formed in various configurations. A transmission line may be simple (formed of a single element) or compound (formed of plural elements). As used herein, a simple or real transmission line is the material medium or structure that forms all or part of a path from one place to another for directing the transmission of energy, such as electromagnetic waves, and that may be characterized by characteristic impedance, transmission-time delay, phase shift, and/or other parameter(s). A compound transmission line, also referred to as an artificial transmission line, may be a four-terminal electrical network that may have the characteristic impedance, transmission-time delay, phase shift, and/or other parameter(s) similar to a real transmission line and therefore can be used to emulate a real transmission line in one or more of these respects. Accordingly, transmission lines 42 and 44 may be simple or compound transmission lines.

There are various ways that transmission lines may be implemented. Transmission lines may be a network of one or more sections of each of a simple transmission line (T), an inductor (L), and/or a capacitor (C). A few non-exclusive examples of transmission lines include series (in signal line) T; series L-shunt (to ground) C-series L; shunt C-series L-shunt C; series T-shunt C-series T; shunt C-series T-shunt C; and series L-shunt T-series L. Other networks may also be used.

Figure 3:
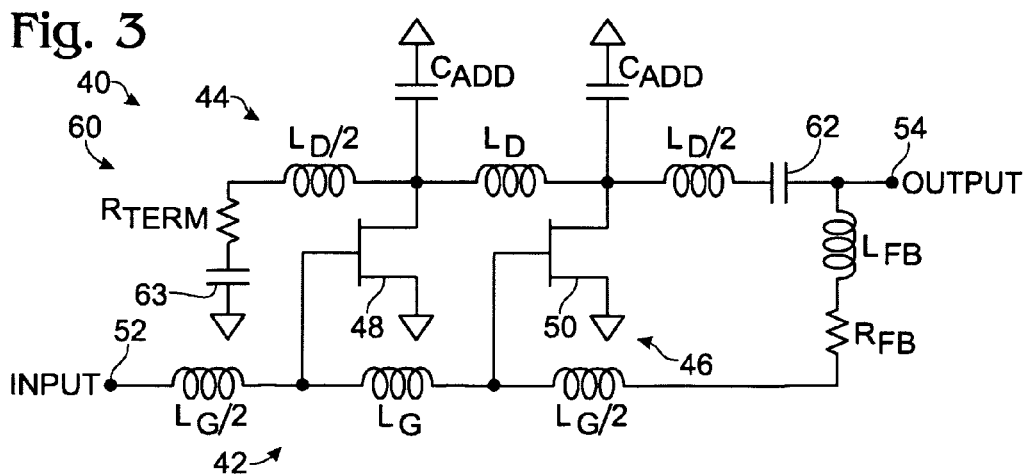
FIG. 3 is a circuit schematic of a second distributed amplifier having feedback.

FIG. 3 illustrates a distributed amplifier 60 as a further example of amplifier 40 shown in FIG. 2. As seen, amplifier 60 may be very similar to amplifier 40, and elements that are the same are given the same reference numbers or names. Equivalent elements include input transmission line 42 with gate inductance $L_G$ and gate inductances $L_G/2$; output transmission line 44 with drain inductance $L_D$ and drain inductances $L_D/2$; active devices 46 including FETs 48 and 50; input port 52; output port 54; drain capacitors $C_{ADD}$; and feedback resistor $R_{FB}$. Terminating resistor $R_{TERM}$, terminating the end of output transmission line 44 distal of output port 54, may also be referred to as $R_{DRAIN}$.

Amplifier 60 may differ from amplifier 40 in that it may have a feedback inductor $L_{FB}$ in series with feedback resistor $R_{FB}$. Feedback inductor $L_{FB}$ may extend between feedback resistor $R_{FB}$ and the output end of output transmission line 44 proximate output port 54. Inductor $L_{FB}$ may be a discrete inductor, a transmission line, or other equivalent device. Also, an in-line or series output capacitor 62 may couple output transmission line 44 to output port 54 and a blocking capacitor 63 may couple $R_{TERM}$ to ground.

Figure 4:
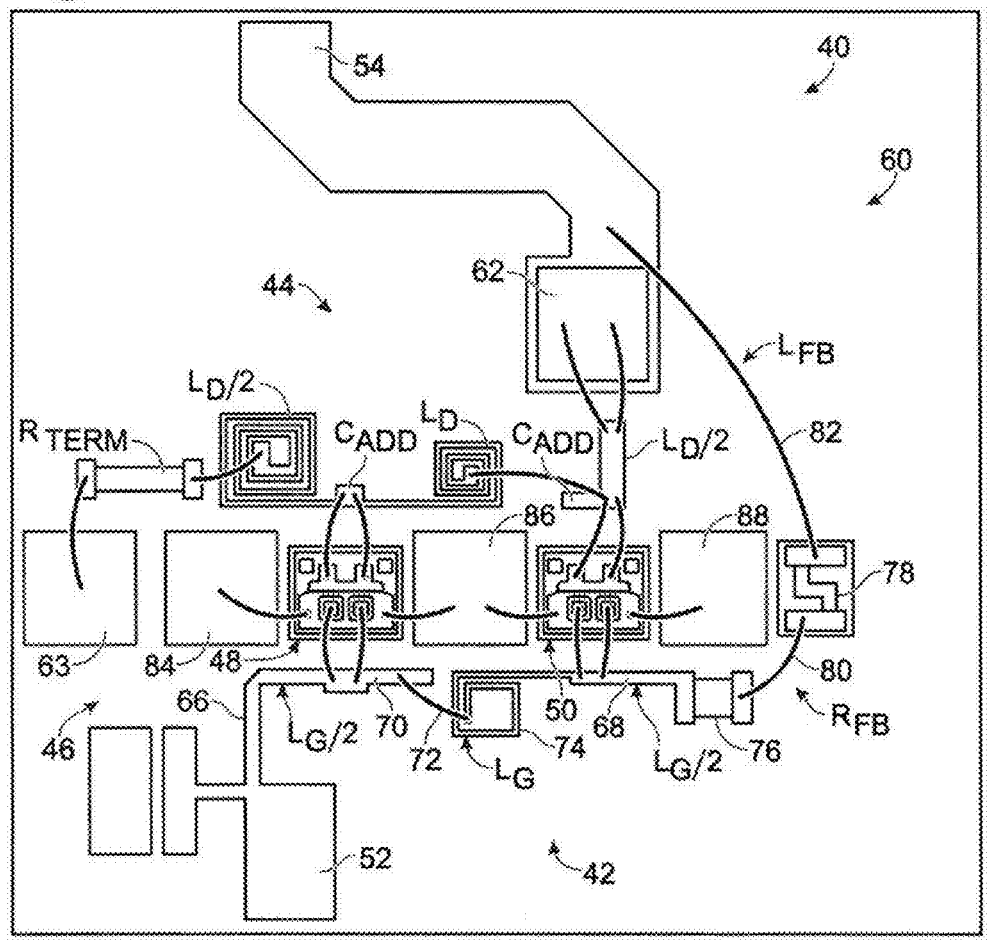
FIG. 4 is a plan view of an embodiment of the second distributed amplifier illustrated in FIG. 3.

FIG. 4 illustrates an embodiment of distributed amplifier 60, with components labeled with the same reference numbers and names as used in FIG. 3. It is seen in this example that the transmission lines 42 and 44 are formed as combinations of continuous conductor sections of varying impedance, bond wires, and inductor coils to provide the desired balance between series inductance and shunt capacitance characteristics of transmission lines. For example, each of inductances $L_G$ and $L_D$, as well as $L_D/2$ connected to terminating resistor $R_{TERM}$, include inductance coils and bond wires as well as lengths of continuous conductor. Further, drain capacitors $C_{ADD}$ are provided by stubs or lateral extensions of portions of transmission line 44, as shown.

Specifically, input transmission line 42 may be connected to input port 52 and include inductances $L_G/2$, including microstrip lines 66 and 68, and inductance $L_G$, including microstrip line 70, lead line 72 and inductor coil 74. Output transmission line 44 may extend from output port 54 and output capacitor 62 to a terminating resistor $R_{TERM}$ in series with capacitor 63 coupled to ground. The output transmission line may include inductances $L_D/2$ and $L_D$. Active devices 46 include FETs 48 and 50.

Feedback is provided by feedback resistor $R_{FB}$ and feedback inductor $L_{FB}$. In this example, feedback resistor $R_{FB}$ includes a first feedback resistor 76 in series with a second feedback resistor 78. Feedback inductor $L_{FB}$ includes lead line 80 connecting resistors 76 and 78 and lead line 82 connecting resistor 78 to output port 54. Additionally, FET 48 includes two source terminals coupled to ground via respective capacitors 84 and 86. Similarly, FET 50 includes two source terminals coupled to ground via respective capacitors 86 and 88.

Figure 5:
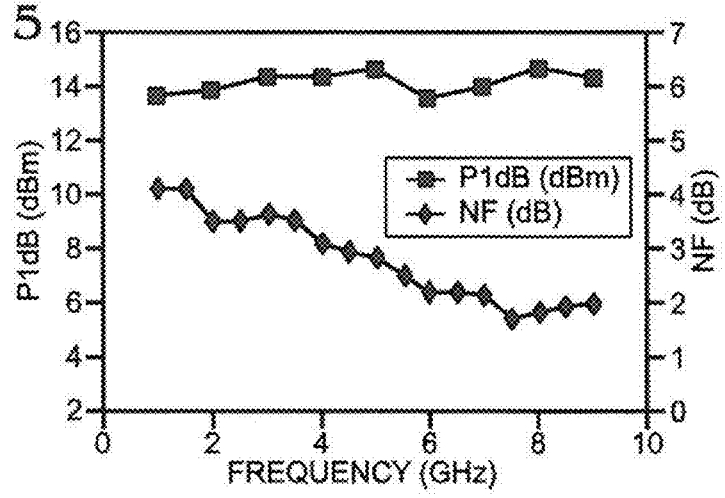
FIG. 5 is a chart illustrating measured gain and noise factor for the distributed amplifier of FIG. 1.

FIG. 5 is a chart illustrating measured power level at 1 dB compression and noise factor for a constructed embodiment of the distributed amplifier of FIG. 1 over a frequency band of about 1 GHz to about 9 GHz. It is seen that the power level is above 13 dBm, but the noise figure varies from about 4 dB at the lower frequencies to just under 2 dB at the higher frequencies.

Figure 6:
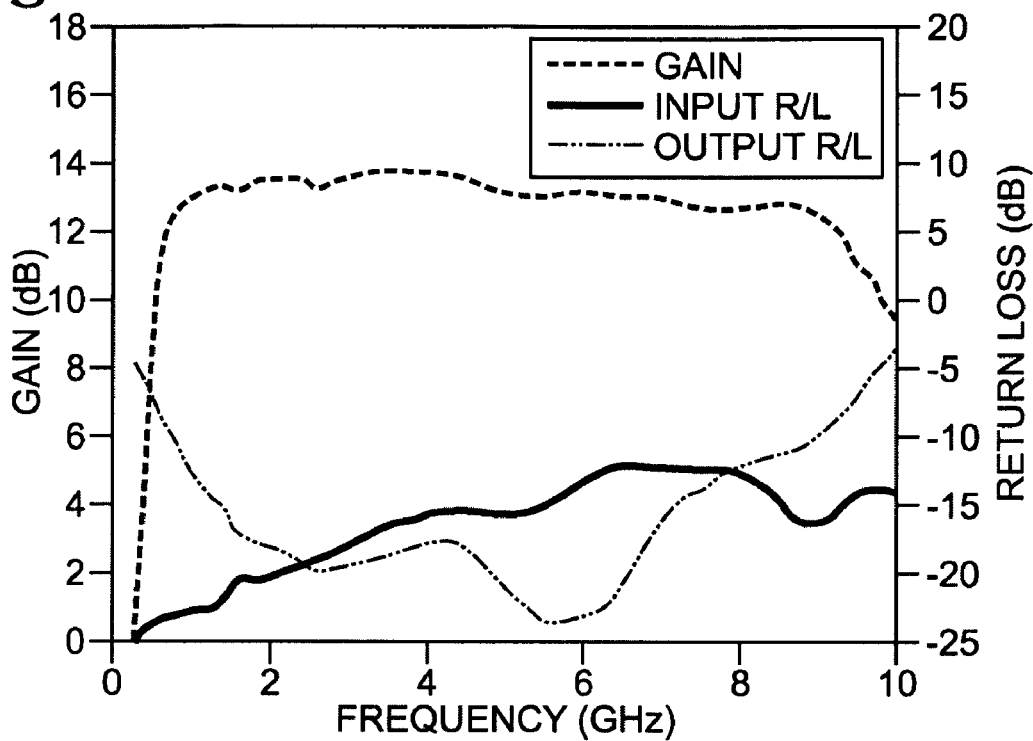
FIG. 6 is a chart illustrating measured gain and input and output return-loss for the distributed amplifier of FIG. 1.

FIG. 6 is a chart illustrating measured gain and input and output return-loss for the constructed embodiment of the distributed amplifier of FIG. 1. It is seen that the gain is above 12 dB for the frequency band of about 1 GHz to about 9 GHz. The input return-loss is seen to be below about −12 dB for this frequency band, and the output return-loss is seen to be generally below about −10 dB.

Figure 7:
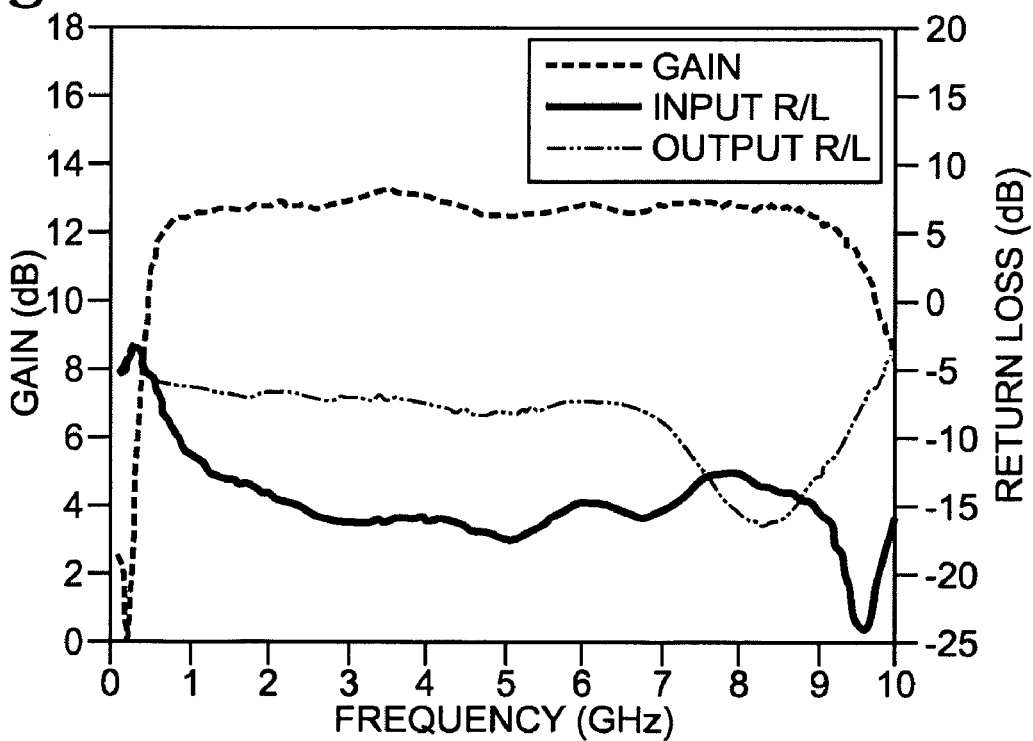
FIG. 7 is a chart illustrating measured gain and input and output return-loss for the distributed amplifier of FIG. 3.

FIG. 7 is a chart illustrating measured gain and input and output return-loss for the distributed amplifier of FIG. 4. It is seen that the gain is 13 Db+/−1 dB for the frequency band of about 1 GHz to about 9 GHz. The input return-loss is seen to be below about −12 dB, and the output return-loss is seen to be generally below −5 dB for the same frequency band.

FIG. 8 is a chart illustrating measured power level at 1 dB compression and noise factor for the distributed amplifier of FIG. 4 designed for operation in a frequency band of 1 to 9 GHz. It is seen in this example that the power level is above about 12 dB, and the noise figure (NF) is a maximum of about 2.2 dB.

It will be appreciated that a distributed amplifier as described having input-transmission-line terminating feedback may have a noise figure that is less than that of a distributed amplifier without feedback. Feedback is provided by terminating the input transmission line with a higher-value resistor connected to the output of the amplifier. Due to the gain and phase reversal of the amplifier, the feedback resistor looks like a 50-ohm load when viewed from the input line, even though its value is much higher. This effect is due to the feedback the resistor provides from the output. However, the feedback does not enter into the noise calculations, and the effect of the higher-value resistor on the noise figure is considerably less than that of a 50-ohm resistor.

The above description is intended to be illustrative, and not restrictive. Many other embodiments will be apparent to those of skill in the art upon reviewing the above description. Accordingly, while embodiments of a distributed amplifier and associated methods of signal processing have been particularly shown and described, many variations may be made therein. Such variations, whether they are directed to different combinations or directed to the same combinations, whether different, broader, narrower, or equal in scope, are also included. This disclosure may include one or more independent or interdependent inventions directed to various combinations of features, functions, elements, and/or properties. Thus, any given invention disclosed by example in the disclosure does not necessarily encompass all or any particular features, characteristics or combinations, except as specifically claimed.

Where "a" or "a first" element or the equivalent thereof is recited, such usage includes one or more such elements, neither requiring nor excluding two or more such elements. Further, ordinal indicators, such as first, second, or third, for identified elements are used to distinguish between the elements, and do not indicate a required or limited number of such elements, and do not indicate a particular position or order of such elements unless otherwise specifically stated.

What is claimed is:

1. A distributed amplifier comprising:
    an input transmission line for receiving on a first end an input signal;
    an output transmission line for outputting on a first end an output signal;
    an output line termination impedance coupled to a second end of the output transmission line opposite the first end of the output transmission line;
    a feedback impedance directly coupling from the first end of the output transmission line to a second end of the input transmission line spaced from the first end of the input transmission line, the feedback impedance arranged to negatively feed back a signal on the output transmission line to the second end of the input transmission line; and
    a plurality of amplifier stages each including an active device having a control terminal and two current-carrying terminals, with the control terminal coupled to the input transmission line at an intermediate position between the first and second ends of the input transmission line, and one current-carrying terminal coupled to the output transmission line at an intermediate position between the first and second ends of the output transmission line.

2. The distributed amplifier of claim 1, wherein there is no input line termination impedance at the second end of the input transmission line.

3. The distributed amplifier of claim 1, wherein the feedback impedance includes a feedback resistance.

4. The distributed amplifier of claim 3, wherein the feedback impedance further includes feedback inductance.

5. The distributed amplifier of claim 1, further comprising output capacitance in the output transmission line adjacent the first end of the output transmission line.

6. The distributed amplifier of claim 5, wherein the output capacitance is disposed in the output transmission line between the at least one amplifier stage and a position on the output transmission line where the feedback impedance is coupled to the output transmission line.

7. The distributed amplifier of claim 6, further comprising a shunt capacitor coupling the intermediate position of the output transmission line to a signal ground.

8. The distributed amplifier of claim 1, wherein the input transmission line has a characteristic impedance, and the feedback resistance has a value that is greater than the characteristic impedance.

9. The distributed amplifier of claim 8, wherein the feedback resistance has a value that is greater than twice the characteristic impedance.

10. The distributed amplifier of claim 8, wherein the feedback resistance has a value that is about ten times the characteristic impedance.

11. A method of amplifying a signal comprising:
    inputting an input signal on a first end of an input transmission line;
    transmitting the input signal along the input transmission line between the first end and a second end opposite the first end;
    amplifying the input signal occurring at a plurality of distributed intermediate positions on the input transmission line between the first and second ends of the input transmission line;
    applying the signal amplified at each intermediate position on the input transmission line to a corresponding intermediate position on an output transmission line between first and second ends of the output transmission line;
    terminating the first end of the output transmission line with a termination impedance; outputting the signal occurring on the second end of the output transmission line; and
    negatively feeding back the signal occurring on the second end of the output transmission line directly to the second end of the input transmission line.

12. The method of amplifying a signal of claim 11, further comprising not terminating the second end of the input transmission line with a termination impedance.

13. The method of amplifying a signal of claim 11, wherein negatively feeding back the signal includes negatively feeding back the signal through a feedback impedance.

14. The method of amplifying a signal of claim 11, wherein negatively feeding back the signal includes negatively feeding back the signal through a feedback resistor.

15. The method of amplifying a signal of claim 14, wherein negatively feeding back the signal includes negatively feeding back the signal through a feedback inductor.

16. The method of amplifying a signal of claim 11, further comprising conducting the signal in the output transmission line through an output capacitor in the output transmission line adjacent to the first end of the output transmission line.

17. The method of amplifying a signal of claim 15, wherein conducting the signal in the output transmission line through the output capacitor includes conducting the amplified signal in the output transmission line through the output capacitor.

18. The method of amplifying a signal of claim 11, wherein negatively feeding back the signal includes negatively feeding back the signal through a feedback resistance having a value that is greater than a characteristic impedance of the input transmission.

19. The method of amplifying a signal of claim 18, wherein negatively feeding back the signal includes negatively feeding back the signal through a feedback resistance having a value that is greater than twice the characteristic impedance of the input transmission.

20. The method of amplifying a signal of claim 19, wherein negatively feeding back the signal includes negatively feeding back the signal through a feedback resistance having a value that is about ten times the characteristic impedance of the input transmission.

* * * * *